(12) United States Patent
Kyogoku et al.

(10) Patent No.: US 10,431,649 B2
(45) Date of Patent: Oct. 1, 2019

(54) SEMICONDUCTOR DEVICE

(71) Applicant: KABUSHIKI KAISHA TOSHIBA, Minato-ku (JP)

(72) Inventors: Shinya Kyogoku, Tsukuba (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/048,679

(22) Filed: Jul. 30, 2018

(65) Prior Publication Data

US 2019/0189736 A1    Jun. 20, 2019

(30) Foreign Application Priority Data

Dec. 15, 2017  (JP) ................. 2017-240816

(51) Int. Cl.
*H01L 29/08* (2006.01)
*H01L 29/06* (2006.01)
(Continued)

(52) U.S. Cl.
CPC ...... *H01L 29/0615* (2013.01); *H01L 29/0696* (2013.01); *H01L 29/086* (2013.01);
(Continued)

(58) Field of Classification Search
None
See application file for complete search history.

(56) References Cited

U.S. PATENT DOCUMENTS 9,653,599 B2    5/2017   Kobayashi et al.
2012/0216086 A1  8/2012   Fujisaki
(Continued)

FOREIGN PATENT DOCUMENTS

JP    2012-174313    9/2012
JP    2014-38963     2/2014
(Continued)

OTHER PUBLICATIONS

Kobayashi, Y et al., "3.3 kV-class 4H-SiC UMOSFET by Double-trench with Tilt Angle Ion Implantation", Materials Science Forum, vol. 858, 2016, pp. 4.

*Primary Examiner* — Daniel Whalen
(74) *Attorney, Agent, or Firm* — Oblon, McClelland Maier & Neustadt, L.L.P.

(57) ABSTRACT

According to one embodiment, a semiconductor device includes a first conductive portion, a first extension portion, a first conductive region, a first extension region, a semiconductor portion, and an insulating portion. The first conductive portion includes a first portion, a second portion, a third portion, a fourth portion, a fifth portion, and a sixth portion. The first extension portion is electrically connected to the first conductive portion. The first conductive region is provided between the first portion and the second portion, between the third portion and the fourth portion, and between the fifth portion and the sixth portion. The first extension region is electrically connected to the first conductive region. The semiconductor portion includes silicon carbide and includes first to third semiconductor regions. The insulating portion is provided between the first conductive portion and the semiconductor portion and between the first extension portion and the semiconductor portion.

20 Claims, 8 Drawing Sheets

(51) Int. Cl.
*H01L 29/16* (2006.01)
*H01L 29/10* (2006.01)
*H01L 29/78* (2006.01)
*H01L 29/739* (2006.01)

(52) U.S. Cl.
CPC ...... *H01L 29/0878* (2013.01); *H01L 29/1037* (2013.01); *H01L 29/1095* (2013.01); *H01L 29/1608* (2013.01); *H01L 29/7397* (2013.01); *H01L 29/7813* (2013.01)

(56) References Cited

U.S. PATENT DOCUMENTS

| | | |
|---|---|---|
| 2016/0005827 A1 | 1/2016 | Nakano et al. |
| 2016/0181372 A1* | 6/2016 | Wada ................ H01L 29/1095 257/77 |
| 2017/0040420 A1 | 2/2017 | Mori et al. |
| 2019/0131398 A1* | 5/2019 | Kyogoku ............ H01L 29/0696 |

FOREIGN PATENT DOCUMENTS

| | | |
|---|---|---|
| JP | 2014-175313 | 9/2014 |
| JP | 2015-207588 | 11/2015 |
| JP | 2017-79251 | 4/2017 |
| JP | 6135364 | 5/2017 |

* cited by examiner

//<br>
SEMICONDUCTOR DEVICE

CROSS-REFERENCE TO RELATED APPLICATIONS

This application is based upon and claims the benefit of priority from Japanese Patent Application No. 2017-240816, filed on Dec. 15, 2017; the entire contents of which are incorporated herein by reference.

FIELD

Embodiments described herein relate generally to a semiconductor device.

BACKGROUND

It is desirable to reduce the on-resistance of a semiconductor device.

DETAILED DESCRIPTION

Figure 1:
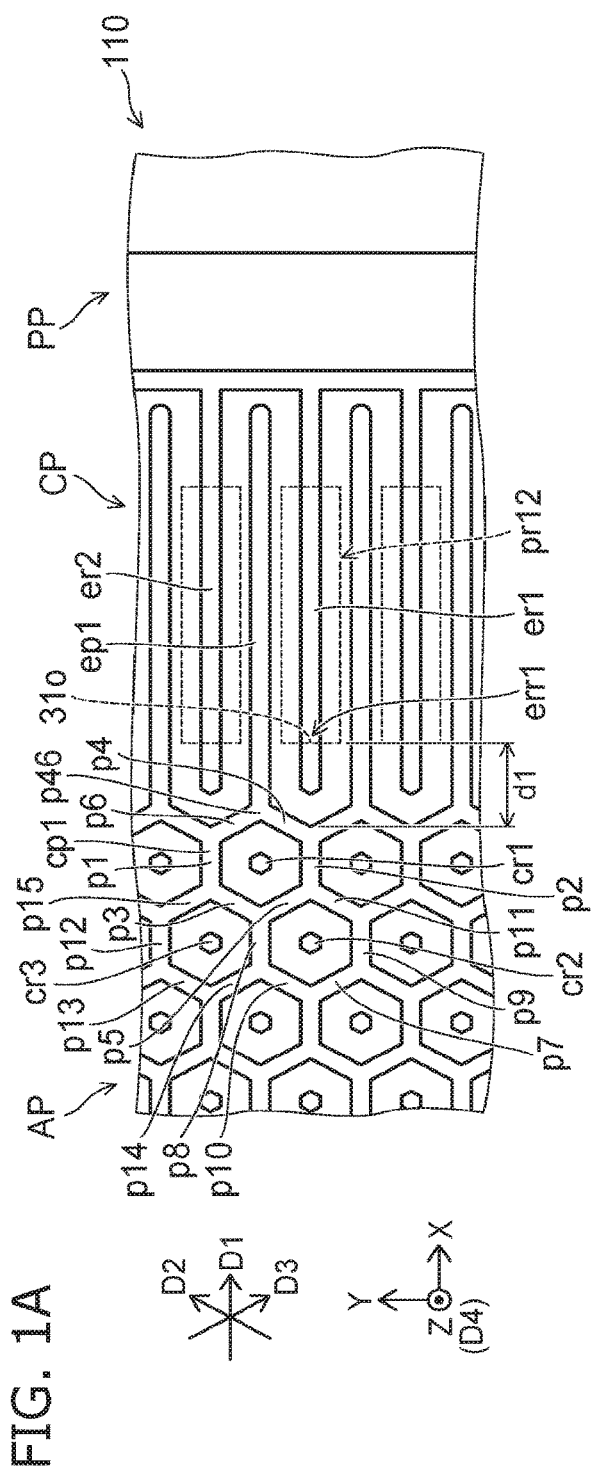
FIG. 1A and FIG. 1B are schematic plan views illustrating a semiconductor device according to an embodiment.

According to one embodiment, a semiconductor device includes a first conductive portion, a first extension portion, a first conductive region, a first extension region, a semiconductor portion, and an insulating portion. The first conductive portion includes a first portion aligned with a first direction, a second portion aligned with the first direction, a direction from the first portion toward the second portion crossing the first direction, a third portion aligned with a second direction crossing the first direction, a fourth portion aligned with the second direction, a direction from the third portion toward the fourth portion crossing the second direction, a fifth portion aligned with a third direction, the third direction crossing the first direction and the second direction and being along a plane including the first direction and the second direction, and a sixth portion aligned with the third direction, a direction from the fifth portion toward the sixth portion crossing the third direction. The first portion is continuous with the third portion and the sixth portion, the third portion is continuous with the first portion and the fifth portion, the fifth portion is continuous with the third portion and the second portion, and the fourth portion is continuous with the second portion and the sixth portion. The first extension portion is aligned with the first direction and electrically connected to the first conductive portion. The first extension portion is conductive. A first extension portion length along the first direction of the first extension portion is longer than a first portion length along the first direction of the first portion and longer than a second portion length along the first direction of the second portion. The first conductive region is provided between the first portion and the second portion, between the third portion and the fourth portion, and between the fifth portion and the sixth portion. The first extension region is aligned with the first direction and electrically connected to the first conductive region. The first extension region is conductive. A first extension region length along the first direction of the first extension region is longer than the first portion length and longer than the second portion length. A direction from the first extension region toward the first extension portion crosses the first direction. The semiconductor portion includes silicon carbide and includes first to third semiconductor regions. The first semiconductor region is of a first conductivity type and includes first to fifth partial regions. A direction from the first partial region toward the first portion is aligned with a fourth direction crossing the plane. A direction from the second partial region toward the first conductive region is aligned with the fourth direction. The third partial region is positioned between the first partial region and the second partial region. A direction from the fourth partial region toward the first extension portion is aligned with the fourth direction. A direction from the fifth partial region toward the first extension region is aligned with the fourth direction. The second semiconductor region is of the first conductivity type and includes a sixth partial region. A second impurity concentration of the first conductivity type in the second semiconductor region is higher than a first impurity concentration of the first conductivity type in the first semiconductor region. The third semiconductor region is of a second conductivity type and includes seventh to tenth partial regions. The seventh partial region is positioned between the third partial region and the sixth partial region in the fourth direction. The eighth partial region is positioned between the second partial region and the first conductive region in the fourth direction. The ninth partial region is positioned between the seventh partial region and the eighth partial region. The tenth partial region is positioned between the fifth partial region and the first extension region in the fourth direction. The insulating portion is provided between the first conductive portion and the semiconductor portion and between the first extension portion and the semiconductor portion.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

Figure 5:
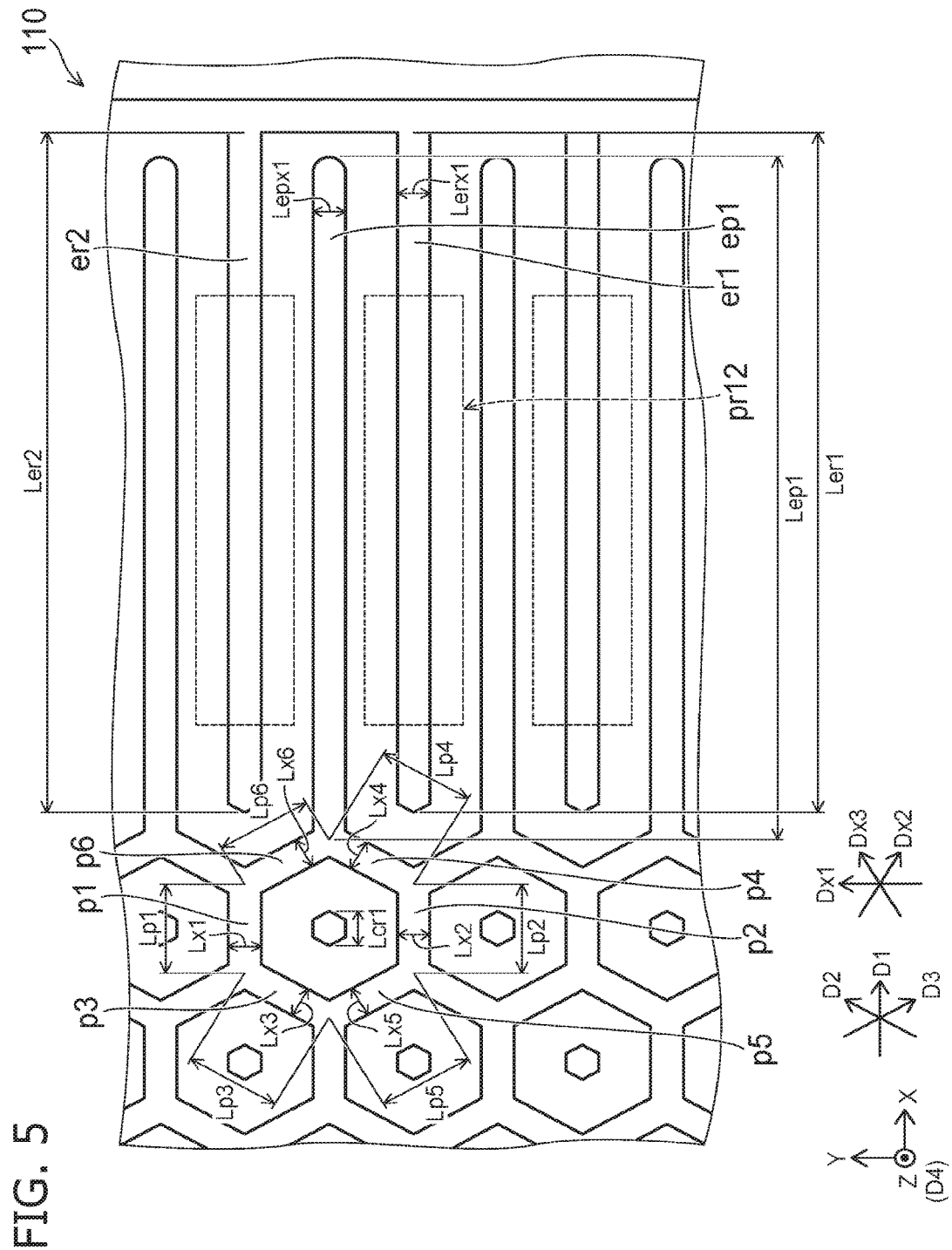
FIG. 5 is a schematic plan view illustrating a semiconductor device according to the embodiment.

FIG. 1A, FIG. 1B, and FIG. 5 are schematic plan views illustrating a semiconductor device according to an embodiment.

Figure 2:
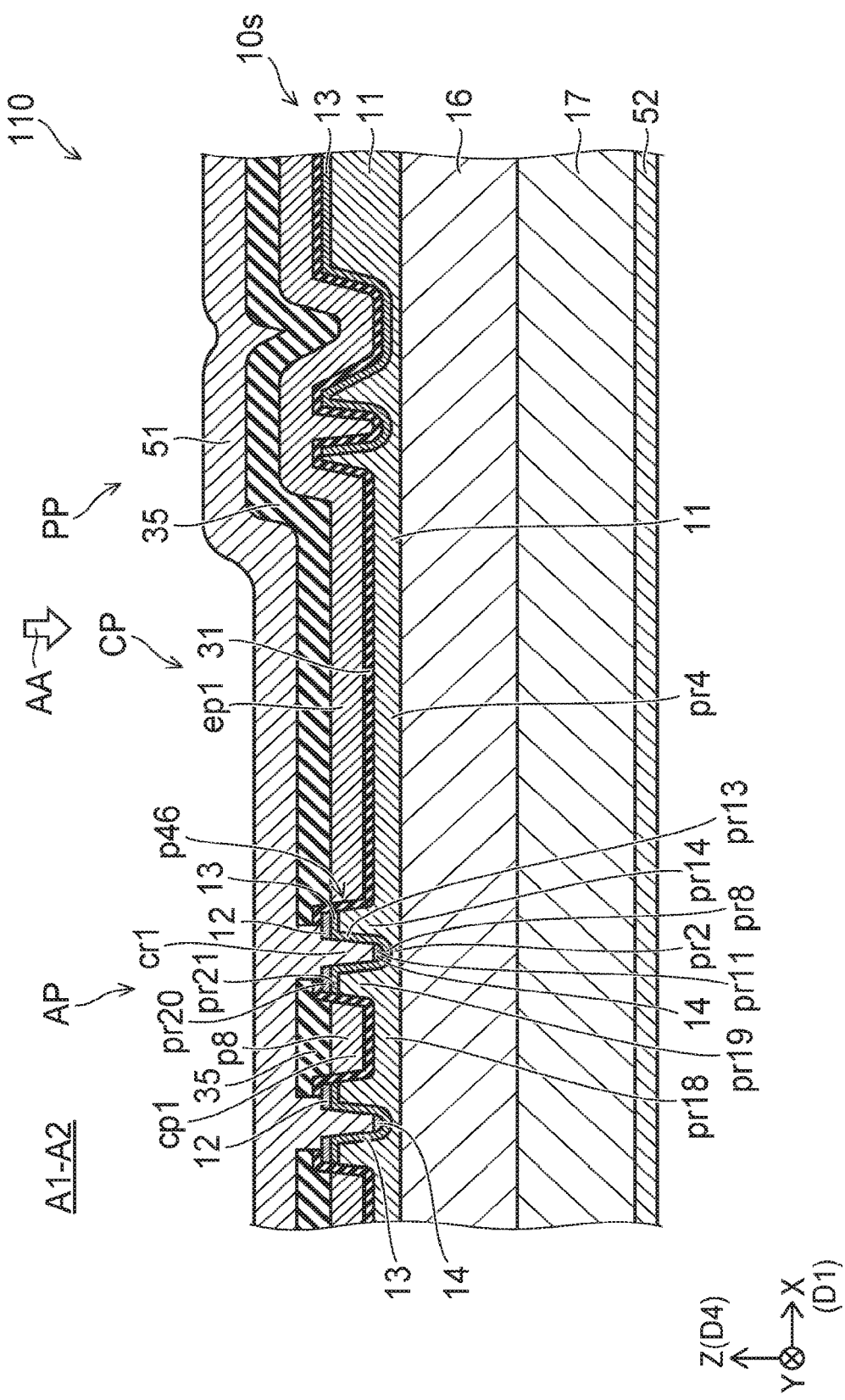
FIG. 2 is a schematic cross-sectional view illustrating the semiconductor device according to the embodiment.
Figure 3:
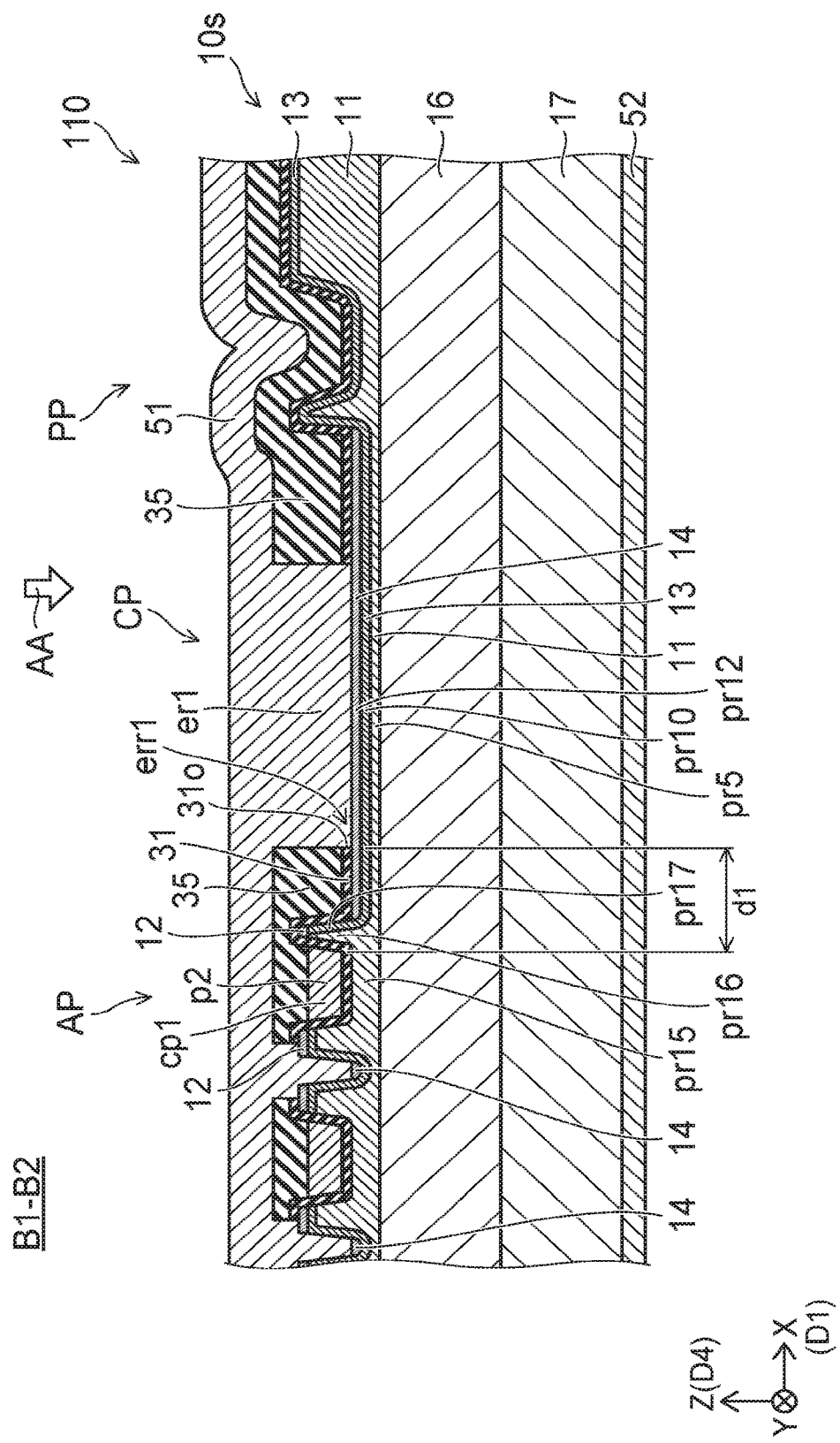
FIG. 3 is a schematic cross-sectional view illustrating the semiconductor device according to the embodiment.
Figure 4:
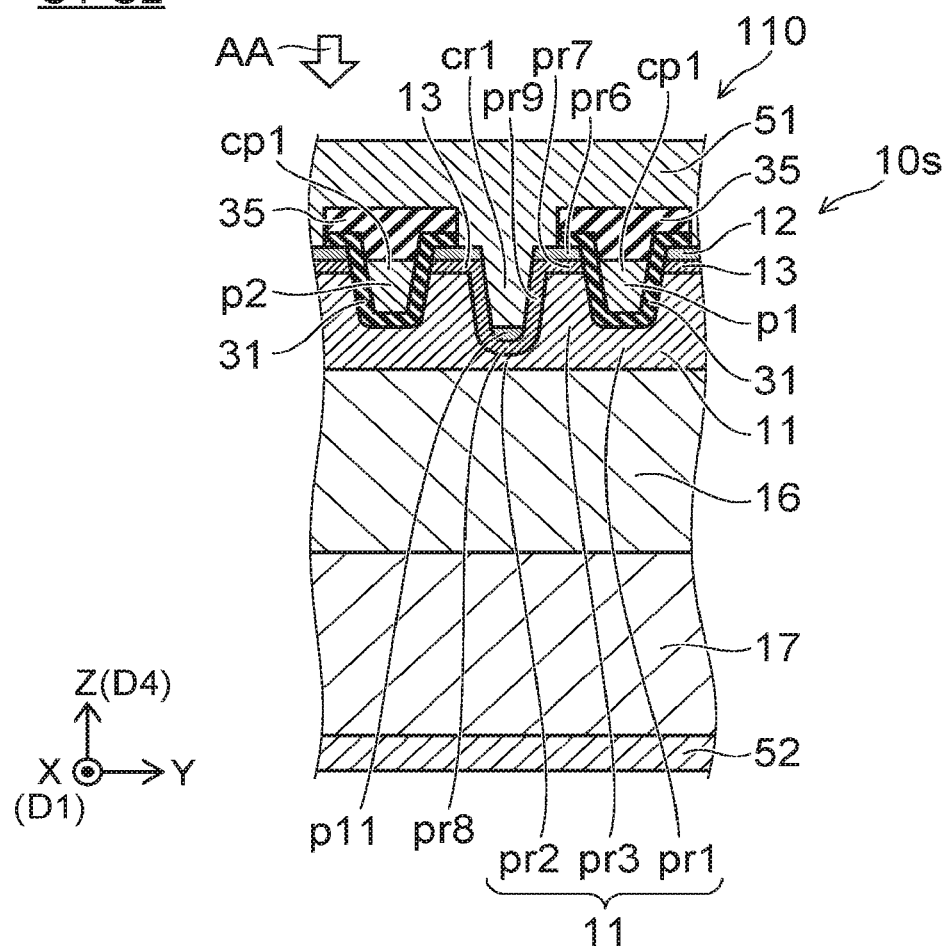
FIG. 4 is a schematic cross-sectional view illustrating the semiconductor device according to the embodiment.

FIG. 2 to FIG. 4 are schematic cross-sectional views illustrating the semiconductor device according to the embodiment.

FIG. 2 is a line A1-A2 cross-sectional view of FIG. 1B. FIG. 3 is a line B1-B2 cross-sectional view of FIG. 1B. FIG. 4 is a line C1-C2 cross-sectional view of FIG. 1B. FIG. 1A, FIG. 1B, and FIG. 5 are plan views when viewed along arrow AA of FIG. 2 to FIG. 4. FIG. 1A and FIG. 5 are plan views in which some of the components are not illustrated.

As shown in FIG. 1A, FIG. 2, FIG. 3, and FIG. 4, the semiconductor device 110 according to the embodiment includes a first conductive portion cp1, a first extension portion ep1, a first conductive region cr1, a first extension region er1, a semiconductor portion 10s, and an insulating portion 31.

The semiconductor portion 10s includes silicon carbide. The semiconductor portion 10s includes, for example, a first semiconductor region 11, a second semiconductor region 12, and a third semiconductor region 13. In the example, the semiconductor portion 10s further includes a fourth semiconductor region 14. The semiconductor portion 10s may further include a fifth semiconductor region 15 described below. The semiconductor portion 10s may further include a sixth semiconductor region 16 and a seventh semiconductor region 17 described below.

As shown in FIG. 1A, the first conductive portion cp1 includes first to sixth portions p1 to p6. The first portion p1 is aligned with a first direction D1. For example, the first portion p1 extends along the first direction D1.

The first direction D1 is taken as an X-axis direction. One direction perpendicular to the X-axis direction is taken as a Y-axis direction. A direction perpendicular to the X-axis direction and the Y-axis direction is taken as a Z-axis direction.

The second portion p2 is aligned with the first direction D1 (the X-axis direction). For example, the second portion p2 extends along the first direction D1. The direction from the first portion p1 toward the second portion p2 crosses the first direction D1.

The third portion p3 is aligned with a second direction D2. For example, the third portion p3 extends along the second direction D2. The second direction D2 crosses the first direction D1. In the example, the angle between the first direction D1 and the second direction D2 is about 60 degrees.

The fourth portion p4 is aligned with the second direction D2. For example, the fourth portion p4 extends along the second direction D2. The direction from the third portion p3 toward the fourth portion p4 crosses the second direction D2.

The fifth portion p5 is aligned with a third direction D3. For example, the third portion p3 extends along the third direction D3. The third direction D3 is along a plane (e.g., the X-Y plane) including the first direction D1 and the second direction D2 and crosses the first direction D1 and the second direction D2. In the example, the angle between the first direction D1 and the second direction D2 is about 60 degrees.

The sixth portion p6 is aligned with the third direction D3. For example, the sixth portion p6 extends along the third direction D3. The direction from the fifth portion p5 toward the sixth portion p6 crosses the third direction D3.

The first portion p1 is continuous with the third portion p3 and the sixth portion p6. The third portion p3 is continuous with the first portion p1 and the fifth portion p5. The fifth portion p5 is continuous with the third portion p3 and the second portion p2. The fourth portion p4 is continuous with the second portion p2 and the sixth portion p6.

The configuration of the first conductive portion cp1 (a portion of the planar configuration) is a hexagon.

The first extension portion ep1 is aligned with the first direction D1. For example, the first extension portion ep1 extends along the first direction D1. The first extension portion ep1 is electrically connected to the first conductive portion cp1. The first extension portion ep1 is conductive.

In the example, the first extension portion ep1 is continuous with the fourth portion p4 and the sixth portion p6. For example, the first extension portion ep1 is connected to a crossing point p46 between the fourth portion p4 and the sixth portion p6.

As shown in FIG. 1A, the first conductive portion cp1 includes multiple hexagonal portions. One of the multiple hexagonal portions includes the first to sixth portions p1 to p6 recited above. In the embodiment, the first extension portion ep1 may not be directly connected to one of the multiple hexagonal portions (one being focused upon). At least a portion of the multiple hexagonal portions may be positioned between the first extension portion ep1 and the hexagonal portion including the first to sixth portions p1 to p6. In an example described below, the first extension portion ep1 is continuous with the fourth portion p4 and the sixth portion p6.

The first conductive region cr1 is provided between the first portion p1 and the second portion p2. The first conductive region cr1 is provided between the third portion p3 and the fourth portion p4. The first conductive region cr1 is provided between the fifth portion p5 and the sixth portion p6.

The first extension region er1 is aligned with the first direction D1 (the X-axis direction). For example, the first extension region er1 extends along the first direction D1 (the X-axis direction). The first extension region er1 is electrically connected to the first conductive region cr1. The first extension region er1 is conductive. The direction from the first extension region er1 toward the first extension portion ep1 (e.g., the Y-axis direction) crosses the first direction D1. In the example, the direction from the second portion p2 toward the first extension region er1 is aligned with the first direction D1 (the X-axis direction).

A first conductive layer 51 is provided as shown in FIG. 1B, FIG. 2, and FIG. 3. FIG. 1A is a schematic view in which the first conductive layer 51 (and an inter-layer insulating portion 35 described below) are not illustrated. A portion of the first conductive layer 51 is used to form the first conductive region cr1 (referring to FIG. 2). Another portion of the first conductive layer 51 is used to form the first extension region er1 (referring to FIG. 3). Thus, the first extension region er1 is electrically connected to the first conductive region cr1.

The first semiconductor region 11, the second semiconductor region 12, and the third semiconductor region 13 include silicon carbide.

The first semiconductor region 11 is of a first conductivity type. The second semiconductor region 12 is of the first conductivity type. The third semiconductor region 13 is of a second conductivity type.

For example, the first conductivity type is an n-type; and the second conductivity type is a p-type. In the embodiment, the first conductivity type may be the p-type; and the second conductivity type may be the n-type. Hereinbelow, the first conductivity type is taken to be the n-type; and the second conductivity type is taken to be the p-type.

The n-type impurity includes, for example, at least one selected from the group consisting of N, P, and As. The p-type impurity includes, for example, at least one selected from the group consisting of B, Al, and Ga.

As shown in FIG. 2 to FIG. 4, the first semiconductor region 11 includes first to fifth partial regions pr1 to pr5.

As shown in FIG. 4, the direction from the first partial region pr1 toward the first portion p1 is aligned with a fourth direction D4. The fourth direction D4 crosses the plane (e.g., the X-Y plane) recited above. The fourth direction D4 is, for example, the Z-axis direction. The direction from the second partial region pr2 toward the first conductive region cr1 is aligned with the fourth direction D4 (e.g., the Z-axis direction). The third partial region pr3 (at least a portion of the third partial region pr3) is positioned between the first partial region pr1 and the second partial region pr2.

As shown in FIG. 4, the direction from the fourth partial region pr4 toward the first extension portion ep1 is aligned with the fourth direction D4 (e.g., the Z-axis direction).

As shown in FIG. 3, the direction from the fifth partial region pr5 toward the first extension region er1 is aligned with the fourth direction D4 (e.g., the Z-axis direction).

As shown in FIG. 4, the second semiconductor region 12 includes the sixth partial region pr6. A second impurity concentration of the first conductivity type in the second semiconductor region 12 is higher than a first impurity concentration of the first conductivity type in the first semiconductor region 11.

For example, the first semiconductor region 11 is of the n-type. For example, the second semiconductor region 12 is of the n$^+$-type.

The impurity concentration of the first conductivity type in the first semiconductor region 11 is not less than $1 \times 10^{15}$ cm$^{-3}$ and not more than $1 \times 10^{18}$ cm$^{-3}$. The impurity concentration of the first conductivity type in the second semiconductor region 12 is not less than $1 \times 10^{17}$ cm$^{-3}$ and not more than $1 \times 10^{21}$ cm$^{-3}$.

As shown in FIG. 4, the third semiconductor region 13 includes seventh to tenth partial regions pr7 to pr10.

As shown in FIG. 4, the seventh partial region pr7 is positioned between the third partial region pr3 and the sixth partial region pr6 in the fourth direction D4 (e.g., the Z-axis direction). The eighth partial region pr8 is positioned between the second partial region pr2 and the first conductive region cr1 in the fourth direction D4. The ninth partial region pr9 is positioned between the seventh partial region pr7 and the eighth partial region pr8. The ninth partial region pr9 connects the seventh partial region pr7 to the eighth partial region pr8. The ninth partial region pr9 is continuous with the eighth partial region pr8. The ninth partial region pr9 is positioned between the first conductive region cr1 and the third partial region pr3 in the Y-axis direction.

As shown in FIG. 3, the tenth partial region pr10 is positioned between the fifth partial region pr5 (the first semiconductor region 11) and the first extension region er1 in the fourth direction D4 (e.g., the Z-axis direction).

The eighth partial region pr8 is electrically connected to the first conductive region cr1. The tenth partial region pr10 is electrically connected to the first extension region er1. For example, the electrical connection of these regions is performed via the fourth semiconductor region 14.

As shown in FIG. 4, for example, the fourth semiconductor region 14 includes an eleventh partial region pr11. The eleventh partial region pr11 is positioned between the eighth partial region pr8 (a portion of the third semiconductor region 13) and the first conductive region cr1 in the fourth direction D4 (e.g., the Z-axis direction).

As shown in FIG. 3, the fourth semiconductor region 14 further includes a twelfth partial region pr12. The twelfth partial region pr12 is positioned between the tenth partial region pr10 (another portion of the third semiconductor region 13) and the first extension region er1 in the fourth direction D4 (e.g., the Z-axis direction).

A fourth impurity concentration of the second conductivity type in the fourth semiconductor region 14 is higher than a third impurity concentration of the second conductivity type in the third semiconductor region 13.

For example, the third semiconductor region 13 is of the p$^+$-type. For example, the fourth semiconductor region 14 is of the p$^{++}$-type.

The impurity concentration of the second conductivity type in the third semiconductor region 13 is not less than $1 \times 10^{16}$ cm$^{-3}$ and not more than $1 \times 10^{20}$ cm$^{-3}$. The impurity concentration of the second conductivity type in the fourth semiconductor region 14 is not less than $1 \times 10^{18}$ cm$^{-3}$ and not more than $1 \times 10^{22}$ cm$^{-3}$.

As shown in FIG. 2 to FIG. 4, the insulating portion 31 is provided between the first conductive portion cp1 and the semiconductor portion 10s and between the first extension portion ep1 and the semiconductor portion 10s. The insulating portion 31 electrically insulates the first conductive portion cp1 and the semiconductor portion 10s from each other. The insulating portion 31 electrically insulates the first extension portion ep1 and the semiconductor portion 10s from each other.

For example, as shown in FIG. 4, a portion of the insulating portion 31 is provided between the first partial region pr1 and the first portion p1 (the first conductive portion cp1) in the fourth direction D4. Another portion of the insulating portion 31 is provided between the third partial region pr3 (the first semiconductor region 11) and the first portion p1 in the Y-axis direction. Another portion of the insulating portion 31 is provided between the seventh partial region pr7 (the third semiconductor region 13) and the first portion p1 in the Y-axis direction. Another portion of the insulating portion 31 is provided between the sixth partial region pr6 (the second semiconductor region 12) and the first portion p1 in the Y-axis direction.

As shown in FIG. 1A, an active portion AP and a peripheral portion PP are provided in the semiconductor device 110. The direction from the active portion AP toward the peripheral portion PP is aligned with the first direction D1. For example, the region between the active portion AP and the peripheral portion PP is aligned with the Y-axis direction. The first extension portion ep1 and the first extension region er1 are provided in the region (a connection portion CP) between the active portion AP and the peripheral portion PP.

An electrode 52 is provided in the example. As shown in FIG. 2 to FIG. 4, at least a portion of the first semiconductor region 11 is positioned in the fourth direction D4 (e.g., the Z-axis direction) between the first conductive portion cp1 and the electrode 52, between the first extension portion ep1 and the electrode 52, between the first conductive region cr1 and the electrode 52, and between the first extension region er1 and the electrode 52.

For example, the first conductive layer 51 (the first conductive region cr1, the first extension region er1, etc.) functions as a source electrode. For example, the electrode 52 functions as a drain electrode. The first conductive portion cp1 functions as a gate electrode. The first extension portion ep1 may function as the gate electrode.

The semiconductor device 110 is, for example, a vertical transistor. For example, the first semiconductor region 11 functions as a drift region. For example, the second semiconductor region 12 functions as a contact region with the source electrode (the first conductive layer 51). At least a portion of the third partial region pr3 of the first semiconductor region 11, the seventh partial region pr7 of the third semiconductor region 13, and the sixth partial region pr6 of the second semiconductor region 12 functions as a channel region. At least a portion of the eleventh partial region pr11 of the fourth semiconductor region 14 functions as a contact region between the eighth partial region pr8 (the third semiconductor region 13) and the first conductive region cr1 (the first conductive layer 51). At least a portion of the twelfth partial region pr12 of the fourth semiconductor region 14 functions as a contact region between the tenth partial region pr10 (the third semiconductor region 13) and the first extension region er1 (the first conductive layer 51).

For example, the first conductive portion cp1 is formed in a gate trench. For example, the first conductive region cr1 is formed in a contact trench.

The sixth semiconductor region 16 and the seventh semiconductor region 17 may be further provided as shown in FIG. 2 and FIG. 3. The sixth semiconductor region 16 is positioned between the first semiconductor region 11 and the electrode 52. The seventh semiconductor region 17 is positioned between the sixth semiconductor region 16 and the electrode 52. The sixth semiconductor region 16 is of the first conductivity type (e.g., the n$^-$-type). For example, the seventh semiconductor region 17 is of the first conductivity type (e.g., the n$^+$-type, and is, for example, an n$^+$-substrate). In such a case, for example, the semiconductor device 110 functions as a MOS transistor. The seventh semiconductor region 17 may be of the second conductivity type (e.g., the p$^+$-type, and may be, for example, a p$^+$-substrate). In such a case, for example, the semiconductor device 110 functions as an IGBT (Insulated Gate Bipolar Transistor).

In the embodiment as recited above, the configuration of the first conductive portion cp1 (a portion of the planar configuration) functioning as the gate electrode is a hexagon. On the other hand, the first extension portion ep1 that is electrically connected to the first conductive portion cp1 has a line configuration. For example, hexagonal cells are provided in the active portion AP of the semiconductor device 110. A region having a pseudo-stripe configuration is provided in the region (the connection portion CP) between the active portion AP and the peripheral portion PP. Thereby, for example, the increase of the on-resistance can be suppressed. The breakdown voltage can be increased without substantially increasing the on-resistance.

In the semiconductor device, the electric field concentrates easily around the active portion AP. In one example, a hexagonal gate trench is provided in the active portion AP; and a contact trench is provided inside the hexagon of the gate trench.

In the first reference example, similarly to the active portion AP, a hexagonal gate trench is provided around the active portion AP as well; and a contact trench is provided inside the hexagon of the gate trench. At the outermost perimeter in the first reference example, a contact trench that has a dot configuration is provided outside the hexagon of the gate trench. In such a first reference example, there is no contact trench outside the gate trench for a portion of the gate trenches of the outermost perimeter. Therefore, the electric field concentrates at the portion of the gate trenches of the outermost perimeter; and the breakdown voltage is low.

On the other hand, at the outermost perimeter in a second reference example, a contact trench that has a line configuration is provided to surround the gate trench. For example, the contact trench that has the line configuration extends along the Y-axis direction illustrated in FIG. 1A. The contact trench that has the line configuration separates the active portion AP and the peripheral portion PP. It is considered that a high breakdown voltage is obtained in the second reference example because the gate trench is surrounded with the contact trench having the line configuration. However, the connection to the peripheral portion PP of the first conductive portion cp1 (the gate) provided in the gate trench is difficult in the second reference example because the contact trench having the line configuration is provided. In the case where the connection of the first conductive portion cp1 to the peripheral portion PP is performed in the second reference example, the connection location of the contact regions having the line configurations to the p$^+$-regions (e.g., the third semiconductor region 13, etc.) is more distal; and the switching characteristics degrade.

Conversely, in the embodiment, for example, the extension region (the first extension region er1) that extends in the X-axis direction (the first direction D1) is provided in the connection portion CP between the active portion AP and the peripheral portion PP. Also, the extension portion (the first extension portion ep1) that extends in the X-axis direction is provided in the connection portion CP. For example, the first extension portion ep1 is connected to the crossing point p46 between the fourth portion p4 and the sixth portion p6 at the hexagon on the outer side (referring to FIG. 1A). On the other hand, the first extension region er1 (the contact trench) exists outside the second portion p2. The first conductive portion cp1 (the gate trench) can be connected to the peripheral portion PP by the extension portion (the first extension portion ep1). Also, the electric field concentration in the second portion p2 can be suppressed because the first extension region er1 is provided at the vicinity of the second portion p2 of the first conductive portion cp1 (the gate trench). It is easy to connect the extension region (the first extension region er1) to the p$^+$-regions (e.g., the third semiconductor region 13, etc.). High switching characteristics can be maintained.

A high breakdown voltage is obtained in the embodiment. A higher channel density is obtained due to the hexagonal cells in the active portion AP. Therefore, a low on-resistance is obtained. For example, a low on-resistance is obtained while maintaining a high breakdown voltage and high switching characteristics. In the embodiment, a semiconductor device can be provided in which the on-resistance can be reduced.

In the embodiment, for example, the first extension portion ep1 and the first extension region er1 have stripe configurations. As shown in FIG. 5, a first extension portion length Lep1 along the first direction D1 of the first extension portion ep1 is longer than a first portion length Lp1 along the first direction D1 of the first portion p1. The first extension portion length Lep1 is longer than a second portion length Lp2 along the first direction D1 of the second portion p2. The first extension portion length Lep1 is, for example, 2 times the first portion length Lp1 or more. The first extension portion length Lep1 is, for example, 2 times the second portion length Lp2 or more.

A first extension region length Ler1 along the first direction D1 of the first extension region er1 is longer than the first portion length Lp1. The first extension region length Ler1 is longer than the second portion length Lp2. The first extension region length Ler1 is, for example, 2 times the first portion length Lp1 or more. The first extension region length Ler1 is, for example, 2 times the second portion length Lp2 or more.

As shown in FIG. 1A and FIG. 5, a second extension region er2 may be further provided. The second extension region er2 is aligned with the first direction D1 (the X-axis direction). The second extension region er2 is electrically connected to the first conductive region cr1 and the first extension region er1.

A second extension region length Ler2 along the first direction D1 of the second extension region er2 is longer than the first portion length Lp1. The second extension region length Ler2 is longer than the second portion length Lp2. The second extension region length Ler2 is, for example, 2 times the first portion length Lp1 or more. The second extension region length Ler2 is, for example, 2 times the second portion length Lp2 or more.

The first extension portion ep1 is provided between the first extension region er1 and the second extension region er2. The multiple extension portions (the first extension portion ep1, etc.) and the multiple extension regions (the first extension region er1 and the second extension region er2) may be provided. The multiple extension portions and the multiple extension regions may be provided alternately.

As described above, the configuration of a portion of the first conductive portion cp1 is a hexagon. The lengths of the six portions (e.g., the sides) included in the hexagon are substantially the same.

For example, as shown in FIG. 5, the second portion length Lp2 is not less than 0.8 times and not more than 1.2 times the first portion length Lp1. A third portion length Lp3 along the second direction D2 of the third portion p3 is not less than 0.8 times and not more than 1.2 times the first portion length Lp1. A fourth portion length Lp4 along the second direction D2 of the fourth portion p4 is not less than 0.8 times and not more than 1.2 times the first portion length Lp1. A fifth portion length Lp5 along the third direction D3 of the fifth portion p5 is not less than 0.8 times and not more than 1.2 times the first portion length Lp1. A sixth portion length Lp6 along the third direction D3 of the sixth portion p6 is not less than 0.8 times and not more than 1.2 times the first portion length Lp1.

As shown in FIG. 5, the first portion length Lp1 is longer than a length Lx1 of the first portion p1 along a first orthogonal direction Dx1. The first orthogonal direction Dx1 is perpendicular to the first direction D1 along the plane (the X-Y plane) recited above. The second portion length Lp2 is longer than a length Lx2 along the first orthogonal direction Dx1 of the second portion p2.

The third portion length Lp3 along the second direction D2 of the third portion p3 is longer than a length Lx3 along a second orthogonal direction Dx2 of the third portion p3. The second orthogonal direction Dx2 is perpendicular to the second direction D2 along the plane (the X-Y plane) recited above. The fourth portion length Lp4 along the second direction D2 of the fourth portion p4 is longer than a length Lx4 along the second orthogonal direction Dx2 of the fourth portion p4.

The fifth portion length Lp5 along the third direction D3 of the fifth portion p5 is longer than the length Lx3 along a third orthogonal direction Dx3 of the fifth portion p5. The third orthogonal direction Dx3 is perpendicular to the third direction D3 along the plane (the X-Y plane) recited above. The sixth portion length Lp6 along the third direction D3 of the sixth portion p6 is longer than a length Lx6 along the third orthogonal direction Dx3 of the sixth portion p6.

The first extension portion length Lep1 is longer than a length Lepx1 of the first extension portion ep1 along the first orthogonal direction Dx1.

The first extension region length Ler1 of the first extension region er1 along the first direction D1 is longer than a length Lerx1 of the first extension region er1 along the first orthogonal direction Dx1.

A first conductive region length Lcr1 of the first conductive region cr1 along the first direction D1 is shorter than the first portion length Lp1. The first conductive region length Lcr1 is shorter than the second portion length Lp2.

For example, as shown in FIG. 1A and FIG. 3, an opening 31o is provided in the insulating portion 31. The first extension region er1 is electrically connected to the third semiconductor region 13 (the tenth partial region pr10) via the fourth semiconductor region 14 (the twelfth partial region pr12) in the opening 31o.

Thus, in the embodiment, the connection is performed in the opening 31o provided in the region (the connection portion CP) having the stripe configuration. In the embodiment, the distance between the connection region (the opening 31o) and the first conductive portion cp1 can be relatively short.

As shown in FIG. 3, the first extension region er1 includes a region err1 contacting the twelfth partial region pr12. The distance that is aligned with the first direction D1 (e.g., the X-axis direction) between the first portion p1 and this region err1 that contacts the twelfth partial region pr12 is taken as a distance d1. In the embodiment, the distance d1 is, for example, not less than 1 times and not more than 5 times the first portion length Lp1. Thereby, for example, good insulative properties between the gate electrode and the source electrode can be ensured.

As shown in FIG. 2, the first semiconductor region 11 may further include a thirteenth partial region pr13. The thirteenth partial region pr13 is positioned between the first conductive region cr1 and the first extension portion ep1 in the first direction D1 (the X-axis direction). The third semiconductor region 13 may further include a fourteenth partial region pr14. The fourteenth partial region pr14 is positioned between the first conductive region cr1 and the thirteenth partial region pr13 in the first direction D1.

As shown in FIG. 3, the first semiconductor region 11 may further include a fifteenth partial region pr15 and a sixteenth partial region pr16. The direction from the fifteenth partial region pr15 toward the second portion p2 is aligned with the fourth direction D4 (e.g., the Z-axis direction). The sixteenth partial region pr16 is positioned between the fifteenth partial region pr15 and the fifth partial region pr5 in the first direction D1 (the X-axis direction). The third semiconductor region 13 may further include a seventeenth partial region pr17. The seventeenth partial region pr17 is positioned between the sixteenth partial region pr16 and the first extension region er1 in the first direction D1.

As described above, multiple hexagonal cells are provided in the active portion AP. Examples of the multiple cells will now be described.

As shown in FIG. 1A, a second conductive region cr2 is further provided. The second conductive region cr2 is electrically connected to the first conductive region cr1 and the first extension region er1. The second conductive region cr2 is a portion of the first conductive layer 51.

The first conductive portion cp1 further includes seventh to eleventh portions p7 to p11.

The seventh portion p7 is aligned with the third direction D3. The fifth portion p5 is positioned between the sixth portion p6 and the seventh portion p7.

The eighth portion p8 is aligned with the first direction D1. The direction from the eighth portion p8 toward the first extension portion ep1 is aligned with the first direction D1 (the X-axis direction).

The ninth portion p9 is aligned with the first direction (the X-axis direction). The direction from the eighth portion p8 toward the ninth portion p9 crosses the first direction D1.

The tenth portion p10 is aligned with the third direction D3. The eleventh portion p11 is aligned with the third direction D3. The direction from the tenth portion p10 toward the eleventh portion p11 crosses the third direction D3.

The second conductive region cr2 is positioned between the fifth portion p5 and the seventh portion p7, between the eighth portion p8 and the ninth portion p9, and between the tenth portion p10 and the eleventh portion p11.

For example, the direction from the second conductive region cr2 toward the second portion p2 is aligned with the first direction D1 (the X-axis direction).

As shown in FIG. 2, for example, the first semiconductor region 11 further includes an eighteenth partial region pr18 and a nineteenth partial region pr19. The direction from the eighteenth partial region pr18 toward the eighth portion p8 is aligned with the fourth direction D4 (e.g., the Z-axis direction). The nineteenth partial region pr19 is positioned between the eighth portion p8 and the first conductive region cr1 in the first direction D1 (the X-axis direction).

As shown in FIG. 2, the second semiconductor region 12 further includes a twentieth partial region pr20. The third semiconductor region 13 further includes a twenty-first partial region pr21. The twenty-first partial region pr21 is provided between the nineteenth partial region pr19 and the twentieth partial region pr20 in the fourth direction D4 (e.g., the Z-axis direction).

As shown in FIG. 1A, the second extension region er2 may be further provided as described above. The second extension region er2 is aligned with the first direction D1 (the X-axis direction) and is electrically connected to the first conductive region cr1 and the first extension region er1. The second extension region er2 is conductive. The second extension region er2 also is electrically connected to the second conductive region cr2. At least a portion of the first extension portion ep1 is positioned between the first extension region er1 and the second extension region er2.

The direction from the first portion p1 toward the second extension region er2 is aligned with the first direction D1 (the X-axis direction).

A third conductive region cr3 may be further provided as shown in FIG. 1A. The third conductive region cr3 is electrically connected to the first conductive region cr1 and the first extension region er1. The third conductive region cr3 may be further electrically connected to the second extension region er2.

For example, the second conductive region cr2, the third conductive region cr3, and the second extension region er2 are included in the first conductive layer 51.

The first conductive portion cp1 further includes twelfth to fifteenth portions p12 to p15.

The twelfth portion p12 is aligned with the first direction D1 (the X-axis direction). The eighth portion p8 is positioned between the ninth portion p9 and the twelfth portion p12.

The thirteenth portion p13 is aligned with the second direction D2. The third portion p3 is positioned between the fourth portion p4 and the thirteenth portion p13.

The fourteenth portion p14 is aligned with the third direction D3. The fourteenth portion p14 is continuous with the eighth portion p8 and the tenth portion.

The fifteenth portion p15 is aligned with the third direction D3. The fifteenth portion p15 is continuous with the third portion p3 and the twelfth portion p12. The direction from the fourteenth portion p14 toward the fifteenth portion p15 crosses the third direction D3.

The third conductive region cr3 is positioned between the eighth portion p8 and the twelfth portion p12, between the thirteenth portion p13 and the third portion p3, and between the fourteenth portion p14 and the fifteenth portion p15.

The direction from the third conductive region cr3 toward the second extension region er2 is aligned with the first direction D1 (the X-axis direction).

As shown in FIG. 2 to FIG. 4, the inter-layer insulating portion 35 is further provided in the semiconductor device 110. The inter-layer insulating portion 35 is provided between the first conductive portion cp1 and the first conductive layer 51. The inter-layer insulating portion 35 is provided between the extension portion (the first extension portion ep1, etc.) and the first conductive layer 51.

In the embodiment, for example, the first direction D1 (the X-axis direction) is aligned with an m-plane of the first semiconductor region 11. For example, the absolute value of the angle between the first direction D1 and the m-plane is, for example, 2 degrees or less.

For example, there is a reference example in which the configuration of the cell provided in the active portion AP is not a hexagon. For example, in a third reference example, multiple quadrilateral cells are provided in the active portion AP; and a contact trench that has a stripe configuration is provided in the connection portion CP. In the third reference example, because the cell of the active portion AP is a quadrilateral, the four sides are aligned with mutually-different crystal planes.

Conversely, in the embodiment, the cell that is provided in the active portion AP is a hexagon. For example, the first conductive portion cp1 includes the first to sixth portions p1 to p6 recited above. The first to sixth portions p1 to p6 are formed in hexagonal configurations. In the embodiment, these first to sixth portions p1 to p6 can correspond to equivalent crystal orientations. For example, the first to sixth portions p1 to p6 each are aligned respectively with the three m-planes of the first semiconductor region 11.

In the embodiment, the first to sixth portions p1 to p6 can correspond to equivalent crystal orientations. Thereby, the characteristics of the channels corresponding to the first to sixth portions p1 to p6 are substantially the same. In the semiconductor device 110, for example, stable characteristics are obtained.

In the embodiment, channels that have equivalent characteristics can be provided with a high density. Thereby, a stable and low on-resistance is obtained.

In the embodiment, the first direction D1 may be along an a-plane of the first semiconductor region 11.

For example, one of the second direction D2 or the third direction D3 may be along an m-plane or an a-plane of the first semiconductor region 11.

For example, the angle between the first direction D1 and the second direction D2 (referring to FIG. 1A) is, for example, not less than 58 degrees and not more than 62 degrees or not less than 118 degrees and not more than 122 degrees. The angle between the first direction D1 and the third direction D3 (referring to FIG. 1A) is not less than 58 degrees and not more than 62 degrees or not less than 118 degrees and not more than 122 degrees.

Figure 6:
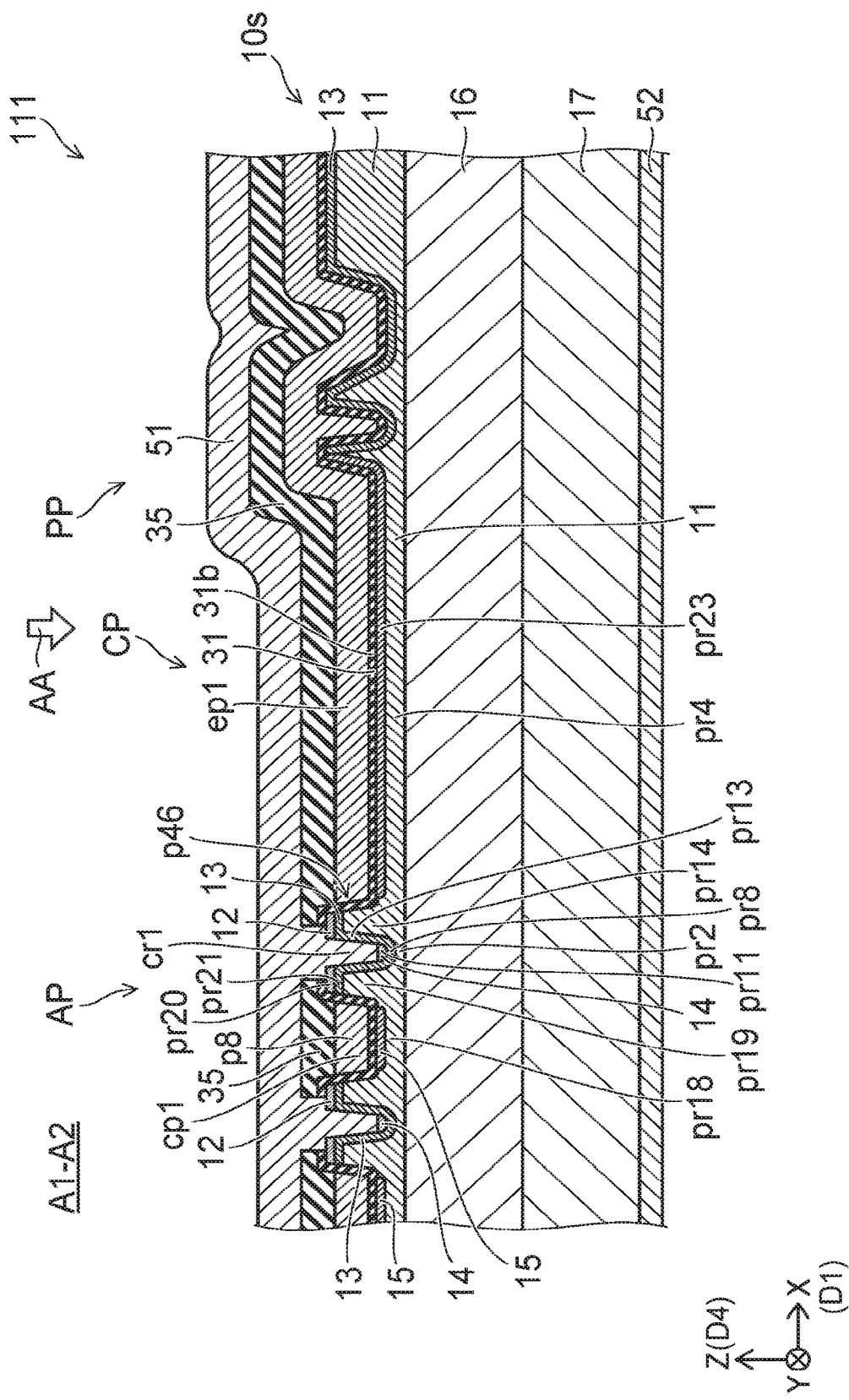
FIG. 6 is a schematic cross-sectional view illustrating another semiconductor device according to the embodiment.
Figure 7:
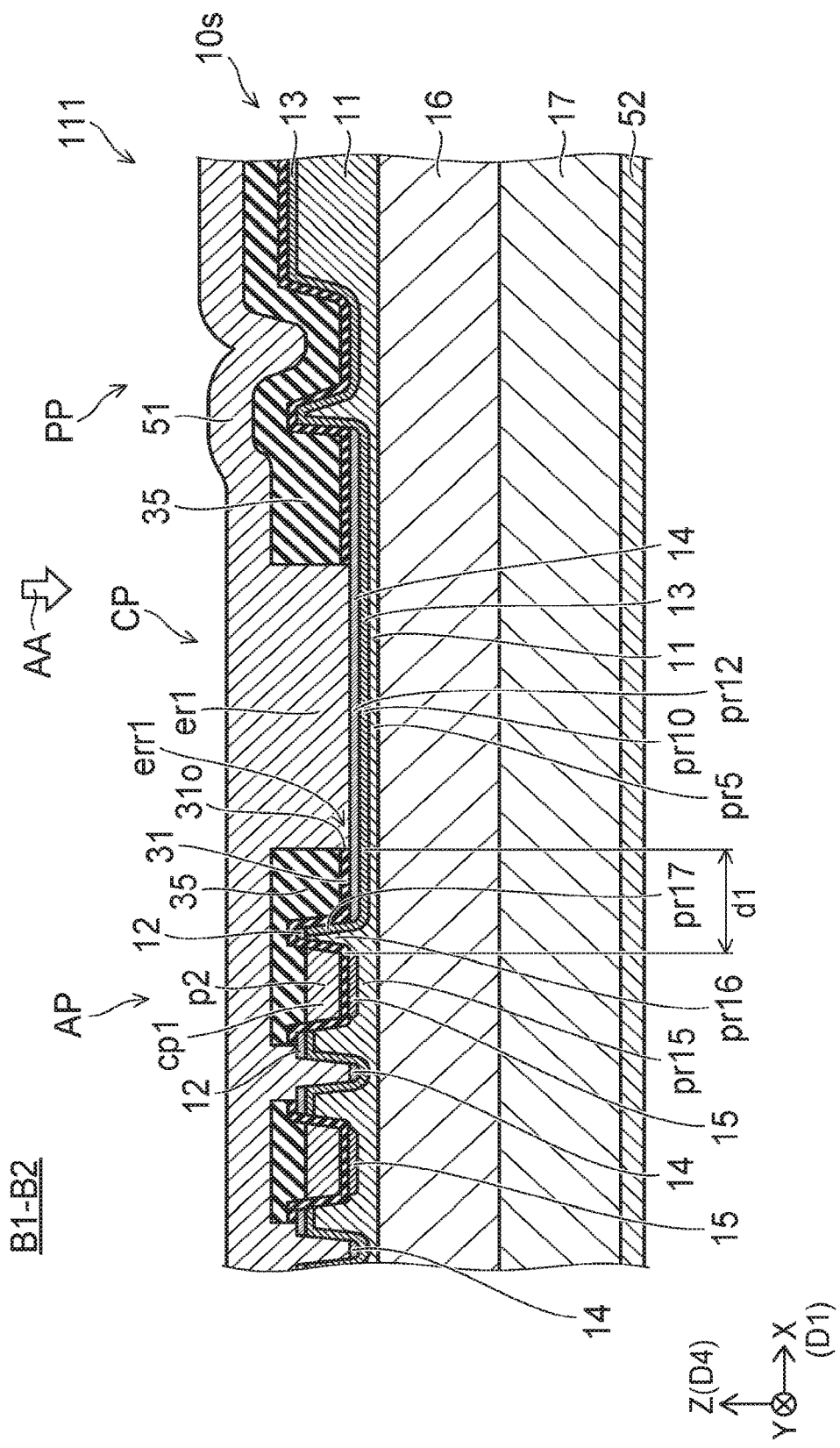
FIG. 7 is a schematic cross-sectional view illustrating another semiconductor device according to the embodiment.
Figure 8:
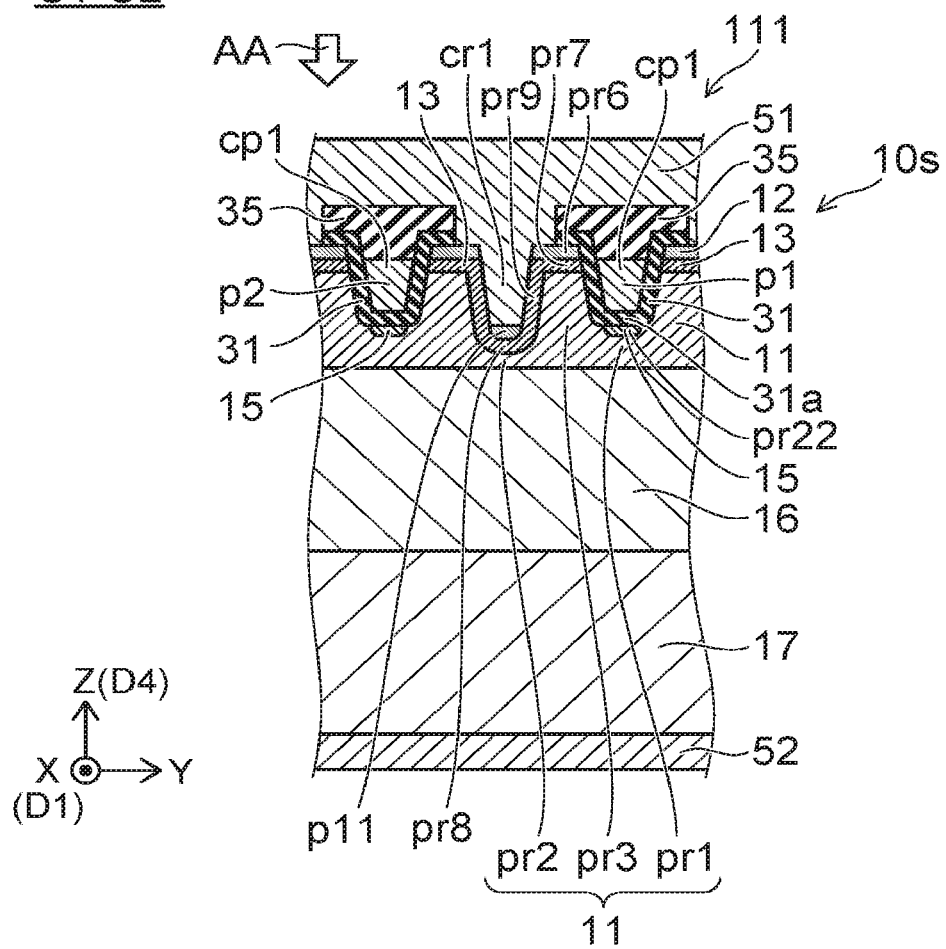
FIG. 8 is a schematic cross-sectional view illustrating another semiconductor device according to the embodiment.

FIG. 6 to FIG. 8 are schematic cross-sectional views illustrating another semiconductor device according to the embodiment.

FIG. 6 is a cross-sectional view corresponding to a line A1-A2 cross section of FIG. 1B. FIG. 7 is a cross-sectional view corresponding to a line B1-B2 cross-sectional view of FIG. 1B. FIG. 8 is a cross-sectional view corresponding to a line C1-C2 cross section of FIG. 1B.

In the semiconductor device 111 according to the embodiment as shown in FIG. 6 to FIG. 8, the fifth semiconductor region 15 is further provided in the semiconductor device 110 described above. Otherwise, the configuration of the semiconductor device 111 is similar to that of the semiconductor device 110. The fifth semiconductor region 15 will now be described.

The fifth semiconductor region 15 is of the second conductivity type. For example, the fifth semiconductor region 15 is of the $p^+$-type. The impurity concentration of the second conductivity type in the fifth semiconductor region 15 may be substantially the same as the impurity concentration of the second conductivity type in the third semiconductor region 13.

As shown in FIG. 8, for example, the fifth semiconductor region 15 includes a twenty-second partial region pr22. As shown in FIG. 6, the fifth semiconductor region 15 may further include a twenty-third partial region pr23.

As shown in FIG. 8, the insulating portion 31 includes a region 31a positioned between the first partial region pr1 and the first portion p1 in the fourth direction D4 (e.g., the Z-axis direction). The twenty-second partial region pr22 is positioned in the fourth direction D4 between the first partial region pr1 and the region 31a positioned between the first partial region pr1 and the first portion p1 recited above.

As shown in FIG. 6, the insulating portion 31 includes a region 31b positioned between the fourth partial region pr4 and the first extension portion ep1 in the fourth direction D4 (e.g., the Z-axis direction). The twenty-third partial region pr23 is positioned in the fourth direction D4 between the fourth partial region pr4 and the region 31b positioned between the fourth partial region pr4 and the first extension portion ep1 recited above.

For example, the insulating portion 31 includes a region between the first conductive portion cp1 and the first semiconductor region 11 in the fourth direction D4. A portion of the fifth semiconductor region 15 is provided in the fourth direction D4 between the first semiconductor region 11 and the region of the insulating portion 31 recited above between the first conductive portion cp1 and the first semiconductor region 11 in the fourth direction D4.

By providing the fifth semiconductor region 15, the electric field at the vicinity of the insulating portion 31 at the lower portion of the first conductive portion cp1 (e.g., the gate trench) can be relaxed. The degradation of this portion of the insulating portion 31 can be suppressed. Thereby, a high breakdown voltage is obtained. Higher reliability is obtained.

In the embodiment, at least one of the first conductive portion cp1 or the first extension portion ep1 includes, for example, polysilicon. The conductive regions (the first to third conductive regions cr1 to cr3, etc.) and the extension regions (the first extension region er1, the second extension region er2, etc.) include a metal (e.g., at least one selected from the group consisting of Al, Ag, Cu, Ti, Ni, Mo, W, and Ta, etc.). The electrode 52 includes a metal (e.g., at least one selected from the group consisting of Ti, Ni, Ag, and Au, etc.). At least one of the insulating portion 31 or the inter-layer insulating portion 35 includes a metal compound (silicon oxide, silicon nitride, aluminum oxide, etc.). In the embodiment, the description recited above is an example; and various modifications of the materials are possible.

In the embodiment, the information that relates to the impurity concentration is obtained by, for example, SIMS (Secondary Ion Mass Spectrometry), etc. In the description recited above, the impurity concentration may be, for example, the carrier concentration.

According to the embodiments, a semiconductor device can be provided in which the on-resistance can be reduced.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as conductive portions, extension portions, conductive regions, extension regions, semiconductor portions, insulating portions, electrodes, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first conductive portion including
 a first portion aligned with a first direction,
 a second portion aligned with the first direction, a direction from the first portion toward the second portion crossing the first direction,
 a third portion aligned with a second direction crossing the first direction,
 a fourth portion aligned with the second direction, a direction from the third portion toward the fourth portion crossing the second direction,
 a fifth portion aligned with a third direction, the third direction crossing the first direction and the second direction and being along a plane including the first direction and the second direction, and a sixth portion aligned with the third direction, a direction from the fifth portion toward the sixth portion crossing the third direction, the first portion being continuous with the third portion and the sixth portion, the third portion being continuous with the first portion and the fifth portion, the fifth portion being continuous with the third portion and the second portion, the fourth portion being continuous with the second portion and the sixth portion;

a first extension portion aligned with the first direction and electrically connected to the first conductive portion, the first extension portion being conductive, a first extension portion length along the first direction of the first extension portion being longer than a first portion length along the first direction of the first portion and longer than a second portion length along the first direction of the second portion;

a first conductive region provided between the first portion and the second portion, between the third portion and the fourth portion, and between the fifth portion and the sixth portion;

a first extension region aligned with the first direction and electrically connected to the first conductive region, the first extension region being conductive, a first extension region length along the first direction of the first extension region being longer than the first portion length and longer than the second portion length, a direction from the first extension region toward the first extension portion crossing the first direction;

a semiconductor portion including silicon carbide and including first to third semiconductor regions, the first semiconductor region being of a first conductivity type and including first to fifth partial regions, a direction from the first partial region toward the first portion being aligned with a fourth direction crossing the plane, a direction from the second partial region toward the first conductive region being aligned with the fourth direction, the third partial region being positioned between the first partial region and the second partial region, a direction from the fourth partial region toward the first extension portion being aligned with the fourth direction, a direction from the fifth partial region toward the first extension region being aligned with the fourth direction, the second semiconductor region being of the first conductivity type and including a sixth partial region, a second impurity concentration of the first conductivity type in the second semiconductor region being higher than a first impurity concentration of the first conductivity type in the first semiconductor region, the third semiconductor region being of a second conductivity type and including seventh to tenth partial regions, the seventh partial region being positioned between the third partial region and the sixth partial region in the fourth direction, the eighth partial region being positioned between the second partial region and the first conductive region in the fourth direction, the ninth partial region being positioned between the seventh partial region and the eighth partial region, the tenth partial region being positioned between the fifth partial region and the first extension region in the fourth direction; and an insulating portion provided between the first conductive portion and the semiconductor portion and between the first extension portion and the semiconductor portion.

2. The device according to claim 1, wherein the first extension portion is continuous with the fourth portion and the sixth portion.

3. The device according to claim 1, wherein a direction from the second portion toward the first extension region is aligned with the first direction.

4. The device according to claim 1, wherein
the eighth partial region is electrically connected to the first conductive region, and
the tenth partial region is electrically connected to the first extension region.

5. The device according to claim 1, wherein
the semiconductor portion further includes a fourth semiconductor region,
an impurity concentration of the second conductivity type in the fourth semiconductor region is higher than an impurity concentration of the second conductivity type in the third semiconductor region,
the fourth semiconductor region includes an eleventh partial region and a twelfth partial region,
the eleventh partial region is positioned between the eighth partial region and the first conductive region in the fourth direction, and
the twelfth partial region is positioned between the tenth partial region and the first extension region in the fourth direction.

6. The device according to claim 1, further comprising an electrode,
at least a portion of the first semiconductor region being positioned in the fourth direction between the first conductive portion and the electrode, between the first extension portion and the electrode, between the first conductive region and the electrode, and between the first extension region and the electrode.

7. The device according to claim 1, wherein the first extension portion length is not less than 2 times the first portion length.

8. The device according to claim 1, wherein
the first portion length is longer than a length of the first portion along a first orthogonal direction, the first orthogonal direction being along the plane and perpendicular to the first direction,
the second portion length is longer than a length along the first orthogonal direction of the second portion,
a third portion length along the second direction of the third portion is longer than a length along a second orthogonal direction of the third portion, the second orthogonal direction being along the plane and perpendicular to the second direction,
a fourth portion length along the second direction of the fourth portion is longer than a length along the second orthogonal direction of the fourth portion,
a fifth portion length along the third direction of the fifth portion is longer than a length along a third orthogonal direction of the fifth portion, the third orthogonal direction being along the plane and perpendicular to the third direction, and
a sixth portion length along the third direction of the sixth portion is longer than a length along the third orthogonal direction of the sixth portion.

9. The device according to claim 8, wherein the first extension portion length is longer than a length of the first extension portion along the first orthogonal direction.

10. The device according to claim 1, wherein a first conductive region length of the first conductive region along the first direction is shorter than the first portion length and shorter than the second portion length.

11. The device according to claim 1, wherein
the first semiconductor region further includes a thirteenth partial region,
the thirteenth partial region is positioned between the first conductive region and the first extension portion in the first direction,
the third semiconductor region further includes a fourteenth partial region, and
the fourteenth partial region is positioned between the first conductive region and the thirteenth partial region in the first direction.

12. The device according to claim 1, wherein
the first semiconductor region further includes a fifteenth partial region and a sixteenth partial region,
a direction from the fifteenth partial region toward the second portion is aligned with the fourth direction,
the sixteenth partial region is positioned between the fifteenth partial region and the fifth partial region in the first direction,
the third semiconductor region further includes a seventeenth partial region, and
the seventeenth partial region is positioned between the sixteenth partial region and the first extension region in the first direction.

13. The device according to claim 1, further comprising a second conductive region electrically connected to the first conductive region and the first extension region,
the first conductive portion further including
a seventh portion aligned with the third direction, the fifth portion being positioned between the sixth portion and the seventh portion,
an eighth portion aligned with the first direction, a direction from the eighth portion toward the first extension portion being aligned with the first direction,
a ninth portion aligned with the first direction, a direction from the eighth portion toward the ninth portion crossing the first direction,
a tenth portion aligned with the third direction, and
an eleventh portion aligned with the third direction, a direction from the tenth portion toward the eleventh portion crossing the third direction,
the second conductive region being positioned between the fifth portion and the seventh portion, between the eighth portion and the ninth portion, and between the tenth portion and the eleventh portion.

14. The device according to claim 13, wherein
the first semiconductor region further includes an eighteenth partial region and a nineteenth partial region,
a direction from the eighteenth partial region toward the eighth portion is aligned with the fourth direction,
the nineteenth partial region is positioned between the eighth portion and the first conductive region in the first direction,
the second semiconductor region further includes a twentieth partial region,
the third semiconductor region further includes a twenty-first partial region, and
the twenty-first partial region is provided between the nineteenth partial region and the twentieth partial region in the fourth direction.

15. The device according to claim 1, further comprising a second extension region aligned with the first direction and electrically connected to the first conductive region and the first extension region, the second extension region being conductive,
a second extension region length along the first direction of the second extension region being longer than the first portion length and longer than the second portion length,
at least a portion of the first extension portion being positioned between the first extension region and the second extension region.

16. The device according to claim 15, wherein a direction from the first portion toward the second extension region is aligned with the first direction.

17. The device according to claim 15, further comprising a third conductive region electrically connected to the first conductive region and the first extension region,
the first conductive portion further including
a twelfth portion aligned with the first direction, the eighth portion being positioned between the ninth portion and the twelfth portion,
a thirteenth portion aligned with the second direction, the third portion being positioned between the fourth portion and the thirteenth portion,
a fourteenth portion aligned with the third direction and continuous with the eighth portion and the tenth portion, and
a fifteenth portion aligned with the third direction and continuous with the third portion and the twelfth portion, a direction from the fourteenth portion toward the fifteenth portion crossing the third direction,
the third conductive region being positioned between the eighth portion and the twelfth portion, between the thirteenth portion and the third portion, and between the fourteenth portion and the fifteenth portion,
a direction from the third conductive region toward the second extension region being aligned with the first direction.

18. The device according to claim 1, wherein
the semiconductor portion further includes a fifth semiconductor region of the second conductivity type,
the fifth semiconductor region further includes a twenty-second partial region and a twenty-third partial region,
the insulating portion includes a region positioned between the first partial region and the first portion in the fourth direction,
the twenty-second partial region is positioned in the fourth direction between the first partial region and the region positioned between the first partial region and the first portion,
the insulating portion includes a region positioned between the fourth partial region and the first extension portion in the fourth direction, and
the twenty-third partial region is positioned in the fourth direction between the fourth partial region and the region positioned between the fourth partial region and the first extension portion.

19. The device according to claim 1, wherein the first direction is aligned with an m-plane or an a-plane of the first semiconductor region.

20. The device according to claim 1, wherein at least one of the second direction or the third direction is aligned with an m-plane or an a-plane of the first semiconductor region.

* * * * *